United States Patent [19]

Monk et al.

[11] Patent Number: 5,635,877

[45] Date of Patent: Jun. 3, 1997

[54] LOW VOLTAGE HIGH FREQUENCY RING OSCILLATOR FOR CONTROLING PHASE-SHIFTED OUTPUTS

[75] Inventors: Trevor K. Monk, Chepstow, United Kingdom; Andrew M. Hall, Edinburgh, Scotland

[73] Assignee: SGS-Thomson Microelectronics Ltd., London, England

[21] Appl. No.: 360,698

[22] PCT Filed: Apr. 27, 1994

[86] PCT No.: PCT/GB94/00891

§ 371 Date: May 5, 1995

§ 102(e) Date: May 5, 1995

[87] PCT Pub. No.: WO94/26026

PCT Pub. Date: Nov. 10, 1994

[30] Foreign Application Priority Data

Apr. 30, 1993 [GB] United Kingdom ............. 9308944

[51] Int. Cl.$^6$ .................................................. H03B 5/24
[52] U.S. Cl. ........................ 331/57; 331/55; 331/177 R; 331/172
[58] Field of Search ...................... 331/45, 46, 55, 331/56, 57, 111, 143, 172, DIG. 3, 34, 108 R, 177 R; 325/272, 278, 281, 285, 288

[56] References Cited

U.S. PATENT DOCUMENTS

| | | | |
|---|---|---|---|
| 3,350,659 | 10/1967 | Henn | 331/57 |
| 4,368,480 | 1/1983 | Senturia | 357/25 |
| 5,357,217 | 10/1994 | Marchesi et al. | 331/57 |
| 5,525,938 | 6/1996 | Monk et al. | 327/285 X |

FOREIGN PATENT DOCUMENTS

| | | |
|---|---|---|
| 0 187 572 | 7/1986 | European Pat. Off. . |
| 0 407 082 | 1/1991 | European Pat. Off. . |

OTHER PUBLICATIONS

Bennett et al., "Sub-Nanosecond Bipolar LSI," *1st I.E.E. European Solid State Circuits Conference*, London, GB, pp. 34–35, 1975.

*IBM Technical Disclosure Bulletin*, 32:(12), pp. 149–151, 1993.

Kumar, U. and S. P. Suri, "A simple digital 2" frequency multiplier," *Int. J. Electronics* 48:(1), pp. 43–45, 1980.

McGahee, T., "Pulse-frequency doubler requires no adjustment," *Electronics* 48:(8), p. 149, Apr. 1975.

Ware, et al., "THPM 14.1: A 200 MHz CMOS Phase-Locked Loop With Dual Phase Detectors," *IEEE International Solid-State Circuits Conference*, New York, USA, pp. 192–193 and 338, Feb. 1989.

*IBM Technical Disclosure Bulletin* 31(2):154–156, 1988, (Jul. 1988).

*Primary Examiner*—David Mis
*Attorney, Agent, or Firm*—David V. Carlson; Seed and Berry LLP

[57] ABSTRACT

A oscillator having two synchronized oscillator rings is described. Synchronization is accomplished by circuitry connected between the outputs of two aligned stages in coupled oscillator rings, the circuitry being operable to maintain outputs of the stages 180° apart in phase.

20 Claims, 7 Drawing Sheets

5,635,877

LOW VOLTAGE HIGH FREQUENCY RING OSCILLATOR FOR CONTROLLING PHASE-SHIFTED OUTPUTS

FIELD OF THE INVENTION

This invention relates to an oscillator, and more particularly to a ring oscillator.

BACKGROUND TO THE INVENTION

New manufacturing processes and new applications are forcing power supplies to lower voltages (3.3 v now, with 2.4 v and 1.5 v being expected soon). Advanced Phase-Locked Loops require stable oscillators which may be varied in frequency by a control signal.

To help achieve frequency stability, oscillators integrated into a noisy VLSI environment often use a regulator to generate a quiet power supply. This usually has to be at an even lower voltage than the normal power supply.

There is thus a desire to provide oscillators which can work at these very low supply voltages and still produce high quality, high frequency output signals.

SUMMARY OF THE INVENTION

According to the present invention there is provided an oscillator comprising two oscillator rings, where each oscillator ring comprises the same number of oscillator stages. Each stage has a single input and a single output and is operable to provide at the output an output signal which is phase-shifted by a controllable amount relative to an input signal provided at the input. Each stage has a current source arranged to receive a control signal to adjust the phase-shift, and the input of each stage is connected to receive the output of a preceding stage. The oscillator further comprises synchronization circuitry connected between the outputs of two aligned stages in the coupled oscillator rings and operable to maintain the outputs 180° apart in phase.

Where there is an even number of stages in each ring the rings are coupled by connection of the output of a last stage in each ring to the input of a first stage in the other ring.

Preferably there is synchronization circuitry between each set of two aligned stages.

The synchronization circuitry can comprise first and second cross-coupled transistors acting in a feedback arrangement between the outputs.

Each stage can comprise first and second transistors, wherein the first transistor has a controllable path connected between an output node and a reference voltage and a control node acting as an input node to the stage. The second transistor has a controllable path connected between the output node and the reference voltage and a control node connected to the output node, the current source being connected to the output node.

For transistors of the same length, the width of the first transistor can be set to m times the width of the second transistor where m>1 to determine the d.c. gain of the stage.

The ratio m determines the shape of the waveform output by the oscillator. The higher the value of m, the more the waveform moves away from a sinusoid to a trapezoidal or sawtooth waveform. Preferably, the value of m is selected to produce a trapezoidal or sawtooth waveform. For a three stage oscillator a value of m close to 2 produces a substantially sinusoidal output. The present invention preferably uses a minimum value of m=2.5 for a three stage ring to produce a trapezoidal or sawtooth output.

The maximum value of m is limited by practical considerations, particularly layout considerations. A practical maximum value for m is likely to be about 10. A trapezoidal or sawtooth waveform has a more stable amplitude over a wide range of frequencies and so can more readily be converted to CMOS levels.

The first and second transistors can be n-channel field effect devices having a gate as the control node and the source-drain path as the controllable path. As the transistors are of the same type, process variations affect the transistors in the same manner. The maximum frequency of operation is limited only by the ratio of gain to gate capacitance.

The current source can comprise a p-channel transistor gated by a control voltage.

The first transistor is preferably operated in its saturation region.

The current sources of each stage can either be controlled by a common control signal or by respective different control signals.

When implemented with each stage being as described herein, the present oscillator can operate at voltages down to a level just above the threshold voltages of the transistors.

The synchronization circuit can be incorporated together with two aligned stages of respective rings to provide a differential oscillator stage for a ring oscillator. The ring oscillator comprises a first pair of transistors each being gated by an input signal and being connected between a respective output node and a reference voltage. The ring oscillator also comprises a second pair of transistors each connected between a respective one of the output nodes and a reference voltage having its gate connected to the associated output node. The oscillator further comprises a third pair of transistors each being connected between a respective one of the output nodes and a reference voltage and having its gate connected to the other one of the output nodes whereby the second and third pair of transistors form a cross-coupled feedback arrangement. Finally, the oscillator comprises respective current sources connected to the output nodes and controllable to control the speed of each stage, the gain of each stage being set by the ratio of size of the first pair of transistors to the second pair of transistors, wherein the ratio of sizes between the third pair of transistors and the second pair of transistors is selected so that the transistors operate in a saturation region to provide a linear differential inverting stage.

For a better understanding of the present invention and to show how the same may be carried into effect, reference will now be made by way of example to the accompanying drawings.

DESCRIPTION OF THE PREFERRED EMBODIMENT

Figure 1:
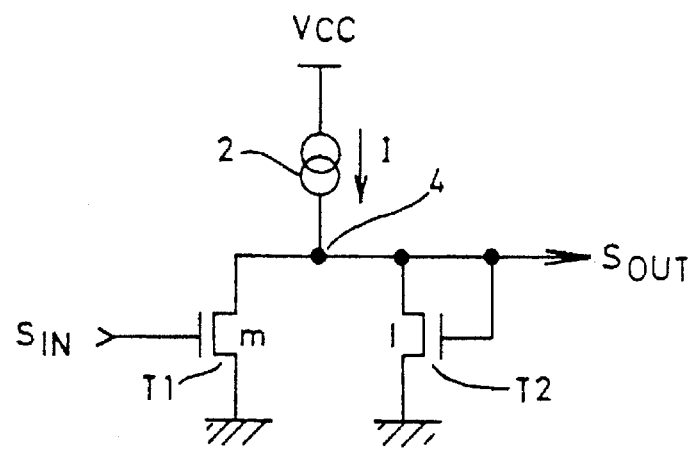
FIG. 1 is a circuit diagram of a low-voltage inverting gain stage in MOS technology.
Figure 1A:
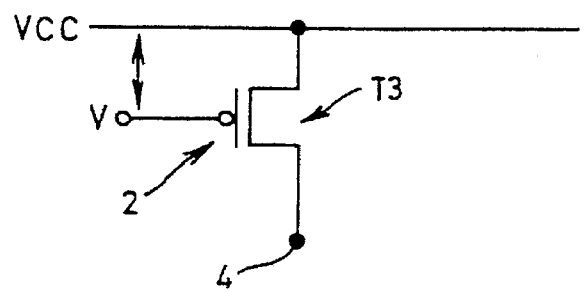
FIG. 1a is a circuit diagram of an implementation of a current source.

FIG. 1 shows a low-voltage inverting gain stage in MOS technology. The stage comprises first and second transistors T1,T2 which have their drains connected together and their sources connected to ground. The gate of the first transistor T1 acts as the input Sin for the stage and the gate of the second transistor T2 acts as the output Sout. The gate of the second transistor T2 is connected to its drain. Each stage is controlled by a control current I which is generated by a current source 2. The current source 2 is connected between a supply voltage Vcc and the drains of the first and second transistors T1,T2. The common node between the current source 2 and the drains of the transistors T1 and T2 is denoted 4. As shown in FIG. 1a, the current source 2 can comprise a p-channel MOS field effect transistor T3 with its source/drain path connected between the supply voltage Vcc and the node 4 and its gate connected to receive a control signal V which is taken with respect to the supply voltage Vcc. In the following discussion, it will readily be apparent that where reference is made to the control current I, this can be taken in practice as being derived from the control voltage V. The stage also has capacitance C, the largest component of which is the gate capacitance of the transistors connected to the output Sout.

The ratio of gains of the transistors T1,T2 is indicated as "m". The value of m controls the relative charge and discharge rates of the output node Sout, and thus determines the gain of the stage. The speed of the stage (and thus the phase shift at the frequency of operation) is readily controlled by varying the current I supplied by the current source 2.

Figure 2:
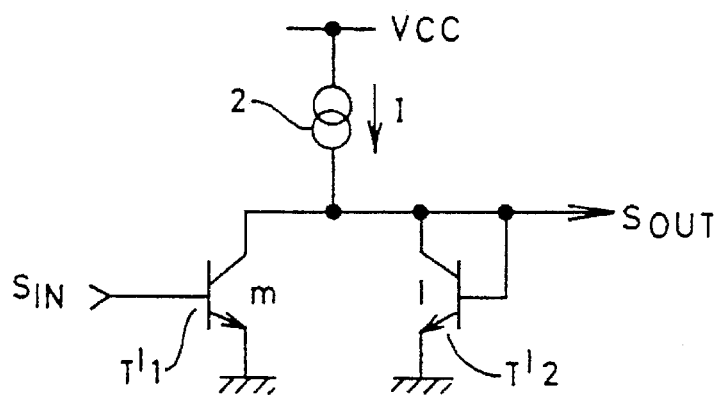
FIG. 2 is a circuit diagram of a low-voltage inverting gain stage in bipolar technology.

FIG. 2 shows the low-voltage inverting gain stage in bipolar technology. This also has excellent low-voltage operation characteristics and the speed can be controlled using a current source 2 in precisely the same way. Although the rest of this specification refers to MOS circuits, it should be understood that the same ideas can easily be applied to bipolar technology.

In FIG. 2, the first and second transistors are denoted T21 and T22 and are connected in the same way as for FIG. 1, where gates correspond to bases, drains correspond to collectors and sources correspond to emitters.

Figure 3:
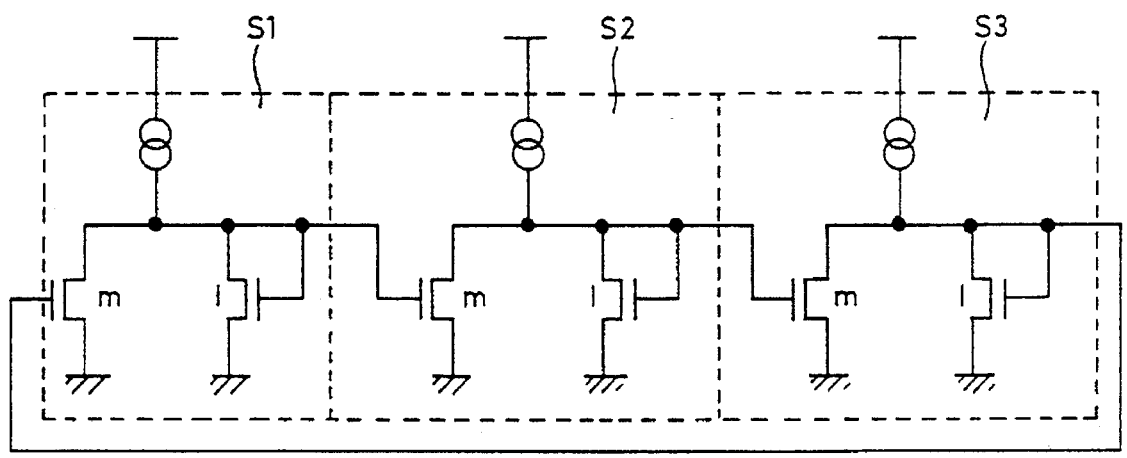
FIG. 3 is a diagram showing the transistor structure of a ring oscillator.
Figure 4:
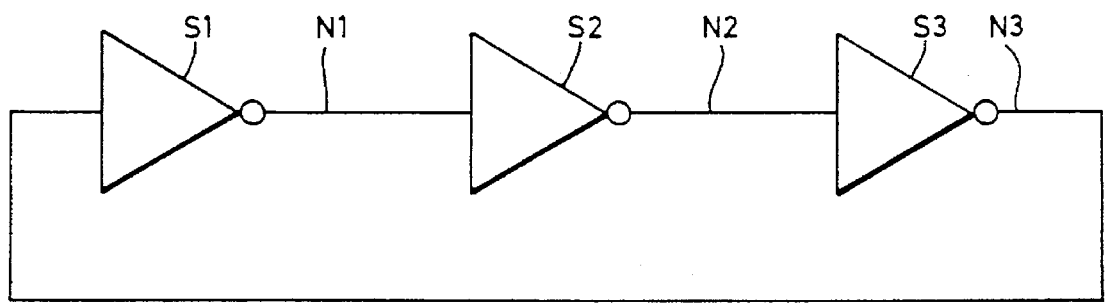
FIG. 4 is an equivalent logical schematic for FIG. 3.

FIG. 3 illustrates a 3-stage ring oscillator, the three stages being denoted S1,S2,S3. Each stage S1,S2,S3 is as illustrated in FIG. 4. Of course, a similar ring oscillator could be produced using the stages of FIG. 2. FIG. 4 shows the ring oscillator in an equivalent logical schematic. Each stage is a so-called single-ended stage, that is with a single input and a single output and is inverting. As is well known in the design of ring oscillators, for oscillation to occur it can be shown that there must be:

(i) an odd number n of stages (ii) minimum of three stages (iii) if all stages are identical and have a gain ratio of "m", then $$m > 1/\cos(pi/n)$$

where pi=3.14 . . .

n=number of stages and m=gain of each stage

For a 3-stage ring, the formula above gives m>2. Where the transistors are of the same length, the gain m=W(T1)/W(T2), where W is the width of a transistor.

Thus, by the use of appropriate layout, the parameter m can be made substantially independent of manufacturing process variables which would tend to affect the width of both transistors by corresponding amounts.

The required value for m, and hence the transistor sizes, is selected to satisfy small signal and large signal design requirements to provide a sawtooth or trapezoidal waveform. A system designed to produce these waveforms produces a more stable output amplitude from the oscillator across all operating frequencies.

Figure 5:
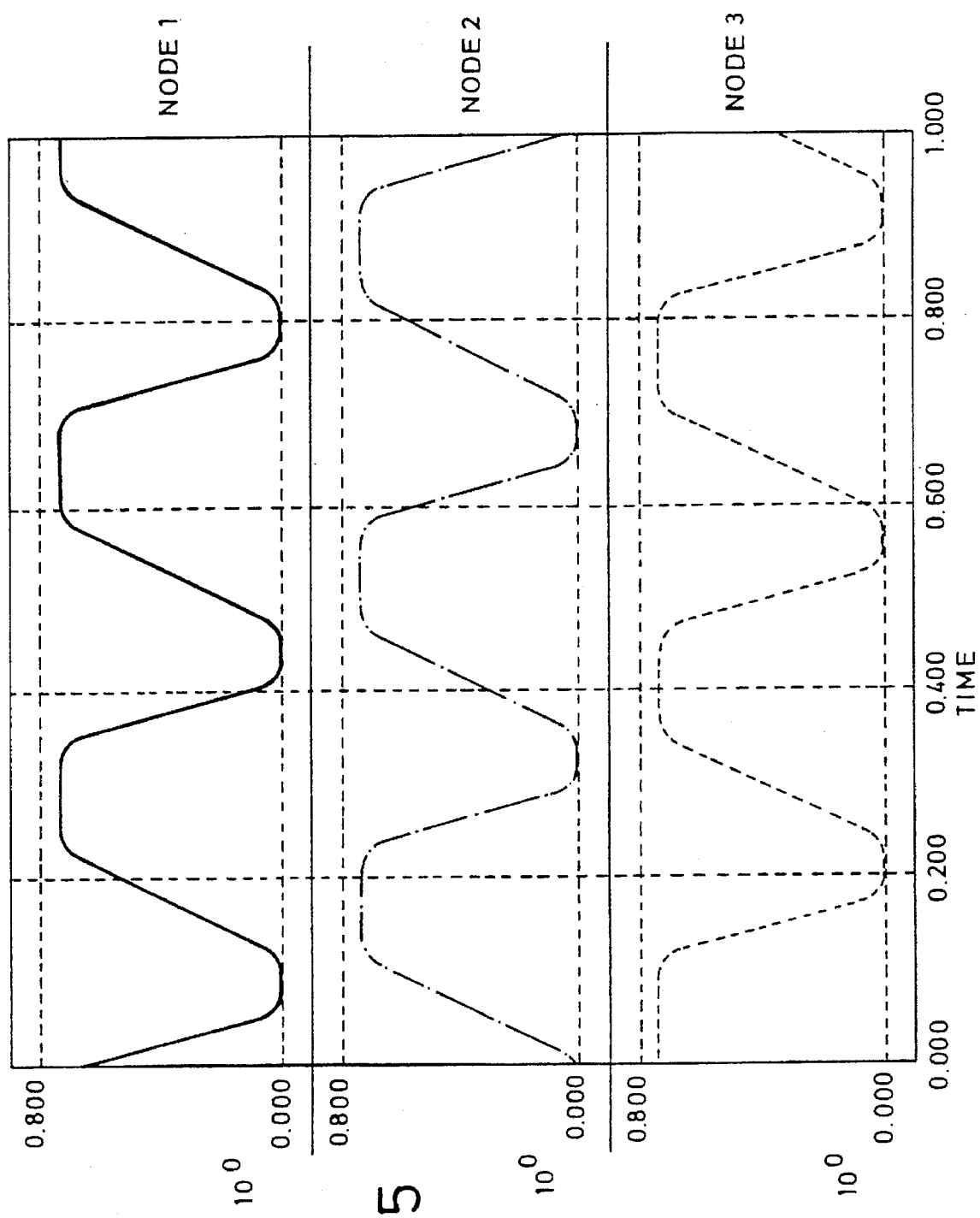
FIG. 5 shows typical waveforms for the 3-stage ring oscillator of FIGS. 3 and 4.

FIG. 5 shows the waveforms for the 3-stage oscillator of FIG. 4 when m=3. Node 1, node 2 and node 3 are denoted N1, N2 and N3 in FIG. 4.

The frequency of oscillation of the ring can be controlled by the control current I. In a symmetrical arrangement, each stage has the same phase shift at the frequency of operation (equal to 180° /n for inverting stages) and receives a common control signal so that the control currents I are the same. However, the phase shift can differ for each stage provided that the complete phase shift in the loop is 360° at the frequency of oscillation. In this case, the control currents I for the individual stages can be independently varied.

Figure 6:
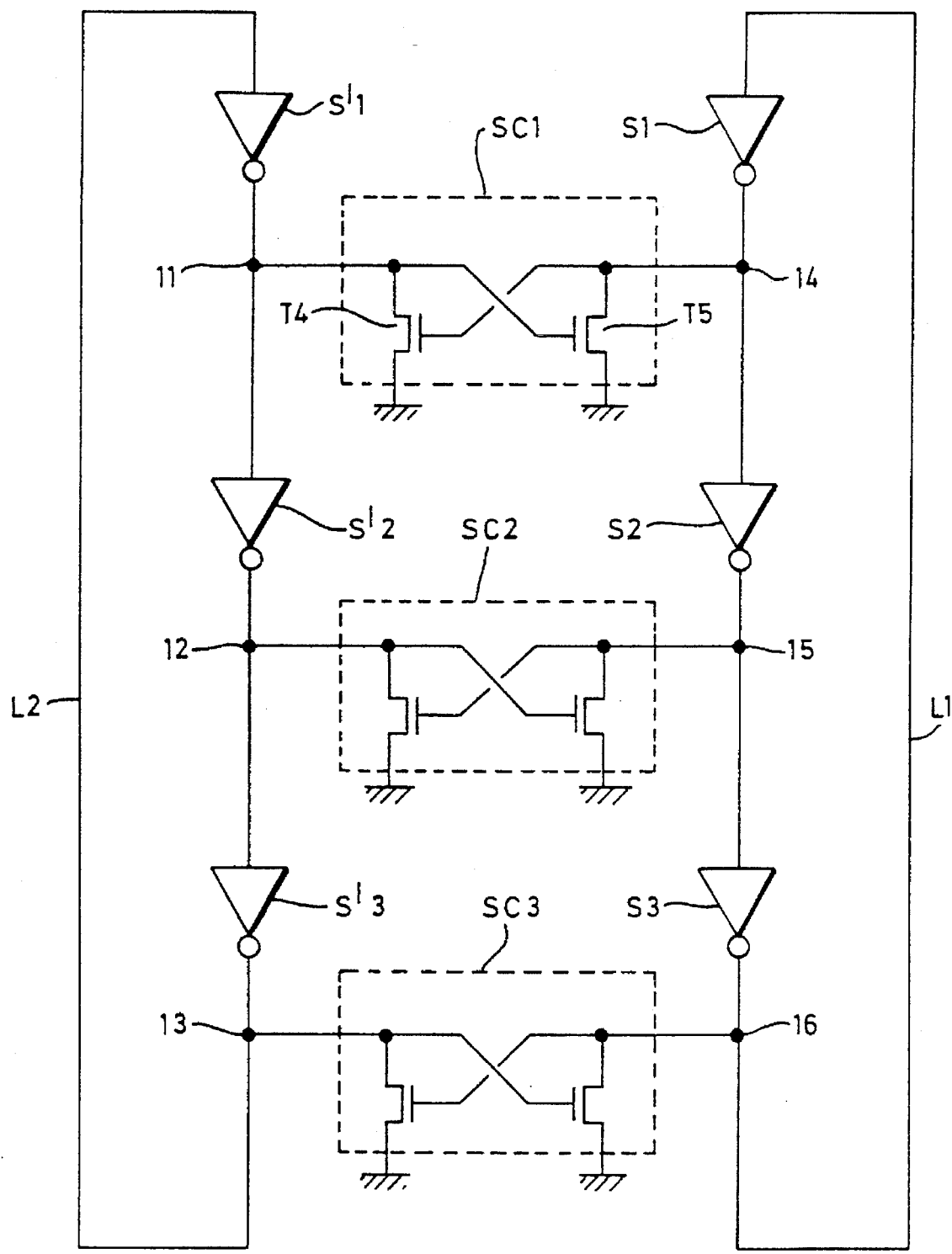
FIG. 6 is a schematic diagram of an oscillator implemented as a pair of linked rings.

FIG. 6 shows how a differential ring oscillator can be constructed from two loops each comprising a plurality of single ended inverting stages. The loop L1 on the right hand side can be considered to be the same as that shown in FIG. 4 with the stages denoted S1,S2,S3. The loop L2 on the left hand side in FIG. 6 is a similar loop with the stages denoted S21,S22,S23. Synchronization circuits SC1,SC2,SC3 are connected respectively between the outputs of commonly aligned stages S1,S21;S2,S22;S3,S23. Each synchronization circuit comprises cross-coupled field effect n-channel-MOS transistors T4,T5. Each transistor has its source connected to ground and their drains connected to the respective gates of the other transistor. The outputs are taken from the drains of the transistors T4,T5 respectively and are connected to the outputs of the stages which are required to be synchronized.

Although a plurality of synchronization circuits are shown, one synchronization circuit may be sufficient to ensure synchronization between the loops. The synchronization circuits maintain the outputs of their respective stages 180° apart in phase.

Figure 7:
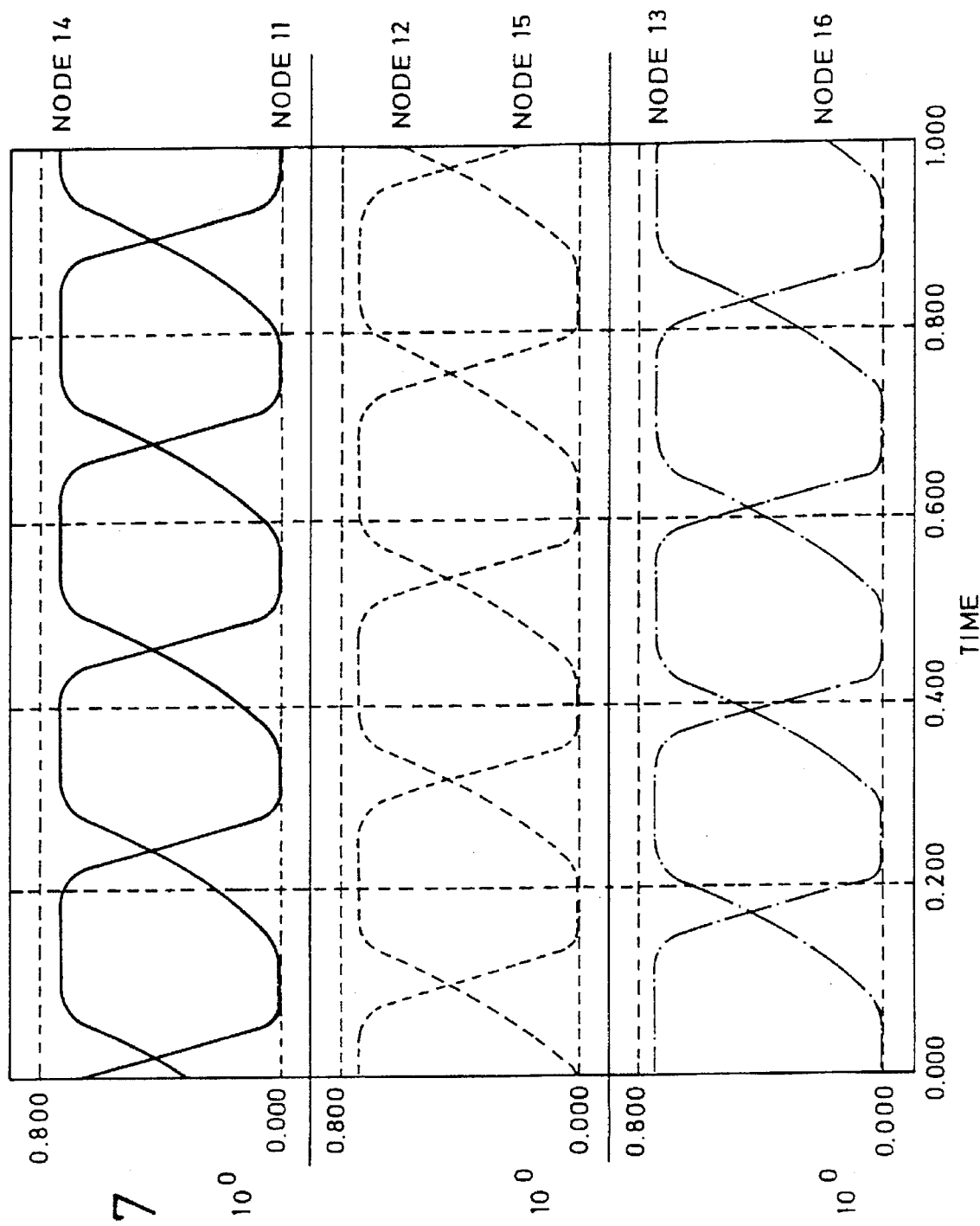
FIG. 7 illustrates typical waveforms for the oscillator of FIG. 6.

FIG. 7 illustrates waveforms at the nodes in FIG. 6 marked 11 to 16.

Note that it is important that the size of the cross-coupled transistors T4,T5 relative to the size of the transistor T2 in each inverter stage should be at a ratio not greater than 1, otherwise the circuit will exhibit hysteresis. This ratio is referred to as x in the following. Note too that the waveforms illustrated in FIG. 7 are with a value of m=3 and x=0.5.

Figure 8:
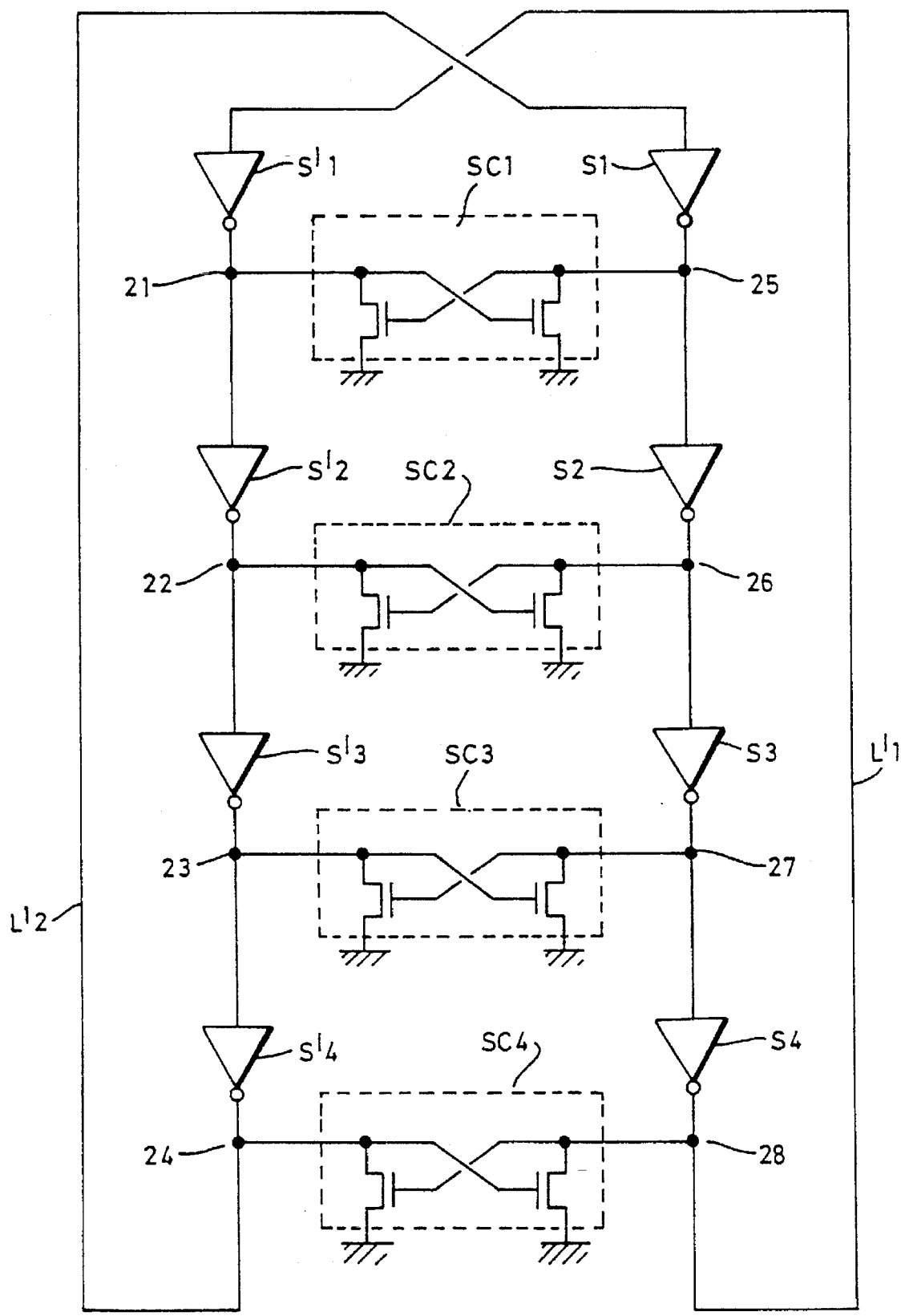
FIG. 8 illustrates an oscillator implemented as linked rings, with an even number of stages in each ring.

It is possible to make an oscillator which has an even number of stages (four or more) in each loop by introducing a crossover as illustrated in FIG. 8. In FIG. 8, each stage is denoted S31 to S34 and S41 to S44 to distinguish them from the stages in FIG. 6. Nevertheless, the stages could be implemented similarly to those in FIG. 6, as described earlier. The right hand loop L1' comprises stages S31 to S34 and the left hand loop L2' comprises stages S41 to S44. Synchronization circuits SC1 to SC4 are provided as in FIG. 6.

Figure 9:
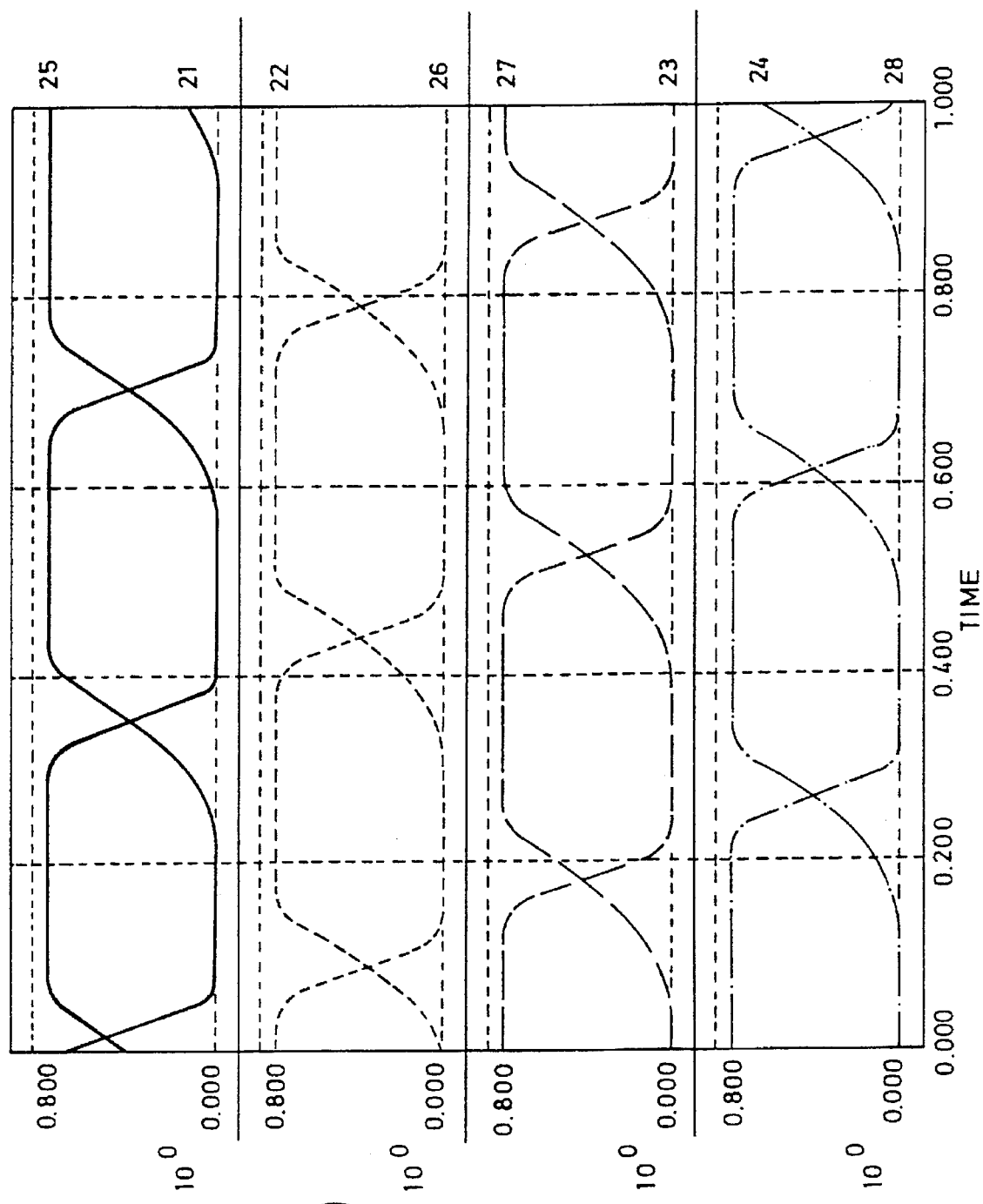
FIG. 9 illustrates typical waveforms for the oscillator of FIG. 8.

Example waveforms for a linked four-stage ring oscillator as shown in FIG. 8 are illustrated in FIG. 9 for the nodes denoted 21,28. The waveforms are given for n=3 and x=0.8.

Linked-ring oscillators are useful for applications where "true" and "complement" output signals are needed (for example to simplify conversion to CMOS-level signals). Linked four-stage rings can also provide quadrature output signals.

We claim:

1. An oscillator comprising: two oscillator rings, each oscillator ring comprising the same number of oscillator stages, each stage having a single input and a single output and being operable to provide at said output an output signal which is phase-shifted by a controllable amount relative to an input signal provided at said input, each stage having a current source arranged to receive a control signal to adjust said phase-shift, the input of each stage being connected to receive the output of a preceding stage, wherein the oscillator further comprises synchronization circuitry connected between the outputs of two aligned stages in the coupled oscillator rings and operable to maintain said outputs 180° apart in phase.

2. An oscillator as claimed in claim 1, wherein there is synchronization circuitry between each set of two aligned stages.

3. An oscillator as claimed in claim 1 wherein the synchronization circuitry comprises first and second cross-coupled transistors acting in a feedback arrangement between said outputs.

4. An oscillator according to claim 1, wherein each stage comprises first and second transistors, wherein the first transistor has a controllable path connected between an output node and a reference voltage and a control node acting as an input node to the stage and wherein a second transistor has a controllable path connected between the output node and the reference voltage and a control node connected to the output node, the current source of each stage being connected to the output node.

5. An oscillator according to claim 4, wherein the gain of each stage is selectively determined by the ratio of the width of the first and second transistors.

6. An oscillator according to claim 4, wherein the first and second transistors are n-channel field effect devices having a gate as the control node and the source/drain path as the controllable path.

7. An oscillator according to claim 4, wherein the first and second transistors are bipolar transistors in which the base is the control node and the controllable path extends between the collector and the emitter.

8. An oscillator according to claim 1, wherein the current source comprises a p-channel MOS field effect transistor gated by a control voltage.

9. An oscillator according to claim 1 wherein the rings are coupled by connection of the output of a last stage in each ring to the input of a first stage in the other ring.

10. An oscillator according to claim 2, wherein the synchronization circuitry comprises first and second cross-coupled transistors acting in a feedback arrangement between said outputs.

11. An oscillator according to claim 5, wherein the first and second transistors are n-channel field effect devices having a gate as the control node and the source/drain path as the controllable path.

12. An oscillator according to claim 5, wherein the first and second transistors are bipolar transistors in which the base is the control node and the controllable path extends between the collector and the emitter.

13. A circuit having two aligned stages of respective rings to provide a differential oscillator stage for a ring oscillator, said circuit comprising:

a first pair of transistors, one transistor of said first pair of transistors being gated by an input signal and the other being gated to a first output node, and said first pair of transistors being connected between said first output node and a first reference voltage;

a second pair of transistors each connected between a second output node and a second reference voltage having one gate of said second pair of transistors connected to said first output node and the other connected to said second output node;

a third pair of transistors each being connected between a third output node and a third reference voltage and having one gate of said third pair of transistors connected to said second output node and the other connected to said third output node and providing said input signal; and respective current sources connected to said output nodes and controllable to control the speed of each stage, the gain of each stage being set by the ratio of size of the first pair of transistors to the second pair of transistor, wherein the ratio of sizes between the third pair of transistors and the second pair of transistors is selected so that the transistors operate in a saturation region to provide a linear differential inverting stage.

14. An oscillator comprising two oscillator rings, each oscillator ring including the same number of oscillator stages, each stage having a single input and a single output and comprising a first n-channel field-effect transistor having a source/drain path connected between an output node and a reference voltage and a gate acting as an input node to the stage, the input of each stage being connected to receive the output of a preceding stage, wherein the oscillator further comprises synchronization circuitry connected between the outputs of two aligned stages in the two oscillator rings and operable to maintain said outputs 180° apart in phase, each stage further comprising:

a second n-channel field effect transistor having a source/drain path connected between the output node and the reference voltage and having a gate connected to the output node; and a controllable current source connected to the output node and comprising a p-channel MOS field-effect transistor arranged to be gated by a control voltage to adjust said phase shift, wherein each stage is operable to provide at said output an output signal which is phase-shifted by a controllable amount relative to an input signal provided at said input.

15. The oscillator as claimed in claim 14 wherein there is synchronization circuitry between each set of two aligned stages.

16. The oscillator as claimed in claim 14 wherein the synchronization circuitry comprises first and second cross-coupled transistors acting in a feedback arrangement between said outputs.

17. The oscillator as claimed in claim 14 wherein the gain of each stage is selectively determined by the ratio of the width of the first and second transistors.

18. The oscillator as claimed in claim 14 wherein the phase shift can differ for each stage, provided that the complete phase shift in the loop is 360° at the frequency of oscillation.

19. The oscillator as claimed in claim 14 wherein the synchronization circuitry connected between the outputs of each two aligned stages.

20. The oscillator as claimed in claim 14 wherein the same number of oscillator stages is an even number of oscillator stages.

* * * * *

UNITED STATES PATENT AND TRADEMARK OFFICE
CERTIFICATE OF CORRECTION

PATENT NO.    : 5,635,877
DATED         : June 3, 1997
INVENTOR(S)   : Trevor K. Monk, et. al.

It is certified that error appears in the above-identified patent and that said Letters Patent is hereby corrected as shown below:

Title page, item [54] and col. 1, line 2, after "FOR" delete "CONTROLING" and substitute therefor --CONTROLLING--.

Colum 6, claim 13, line 18, after the second instance of"of" delete "transistor," and substitute therefor -- transistors, --.

Signed and Sealed this

Twentieth Day of October, 1998

*Attest:*

BRUCE LEHMAN

*Attesting Officer*    *Commissioner of Patents and Trademarks*